United States Patent [19]

Lee et al.

[11] 4,160,275

[45] Jul. 3, 1979

[54] ACCESSING ARRANGEMENT FOR MEMORIES WITH SMALL CELLS

[75] Inventors: Hsing-San Lee, Williston; Wilbur D. Pricer, Burlington; Norbert G. Vogl, Jr., Colchester, all of Vt.

[73] Assignee: International Business Machines Corporation, Armonk, N.Y.

[21] Appl. No.: 892,605

[22] Filed: Apr. 3, 1978

[51] Int. Cl.[2] .................... G11C 11/24; G11C 7/06
[52] U.S. Cl. ................................ 365/149; 365/205
[58] Field of Search ................ 365/149, 183, 205; 307/221 D, DIG. 3; 357/24

[56] References Cited

U.S. PATENT DOCUMENTS

| | | | |
|---|---|---|---|
| 3,760,381 | 9/1973 | Yao | 365/205 |
| 3,949,381 | 4/1976 | Dennard et al. | 365/205 |
| 4,069,475 | 1/1978 | Boettcher | 365/205 |
| 4,070,590 | 1/1978 | Ieda et al. | 365/205 |

Primary Examiner—Stuart N. Hecker
Attorney, Agent, or Firm—Stephen J. Limanek

[57] ABSTRACT

A merged charge memory system is provided having an accessing arrangement wherein each of the word lines of the memory array is divided into a plurality of segments with cells associated only with a selected one or a portion of the segments being coupled at any particular time to bit driving and sensing means. Thus, only relatively few sense amplifiers compared with the number of bits per word of the array are required to handle all of the cells of the array. More particularly, in the merged charge memory system of the present invention, the flow of charges from charge source means is released only to the cells of the selected word segment or segments which are simultaneously coupled to bit driving and sensing means via associated bit/sense lines.

11 Claims, 7 Drawing Figures

ACCESSING ARRANGEMENT FOR MEMORIES WITH SMALL CELLS

DESCRIPTION

1. Technical Field

This invention relates to integrated semiconductor memory circuits and more particularly to memory circuits which employ a small capacitor for storing binary digits of information.

2. Background Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line. In also commonly assigned U.S. Pat. No. 3,811,076 by W. M. Smith and U.S. Pat. No. 3,841,926 by R. H. Garnache and W. M. Smith, both filed Jan. 2, 1973, there is disclosed a one-device field effect transistor memory cell of the type described in the above-identified Dennard patent which is made to a small size by utilizing a layer of doped polycrystalline silicon separated by a dielectric medium disposed on the surface of a semiconductor substrate for forming a storage capacitor.

In commonly assigned U.S. Pat. No. 3,979,734, filed June 16, 1975, by W. D. Pricer and J. E. Selleck, there is described a memory array made of small cells which employ storage capacitors and bipolar transistors. In this array, each storage capacitor of these cells has simply one capacitor terminal or plate connected to a separate bit/sense line while selected cells forming a word are simultaneously accessed by utilizing a word pulse for coupling to the other terminal or plate of the storage capacitors of that word.

In another commonly assigned U.S. Pat. No. 4,080,590, filed Mar. 31, 1976, by W. D. Pricer, there is disclosed a merged charge memory produced in a unipolar technology which is provided with very small capacitor cells, each of which includes substantially only a small storage capacitor having a bit/sense line connected to one terminal of the capacitor and a word line providing a coupling to the other terminal of the capacitor. In an embodiment of that invention, a direct current source of charges is produced at the surface of a semiconductor substrate and a plurality of inversion storage capacitors are formed also at the surface of the semiconductor substrate in a spaced-apart relationship from the charge source.

Voltage pulses representing binary digits are applied to one terminal of the capacitors and the other terminal of the capacitors is coupled to the direct current source of charges by the application of a word pulse to a word line.

In yet another commonly assigned U.S. Pat. No. 4,040,017, filed Aug. 2, 1977, by H. S. Lee, there is disclosed a capacitor memory similar to that disclosed in the above-identified U.S. Pat. No. 4,080,590 wherein the charges are produced from a charge source in the form of pulses injected into the storage capacitors rather than by utilizing a direct current source of charges.

Semiconductor memories have generally been accessed in what is known as a two-dimensional accessing arrangement wherein a single word line controls a number of memory cells with each cell having a bit/sense line connected to input/output or control circuitry. However, it is known in the prior art, particularly in the magnetic memory art, that the input/output or control circuitry may be coupled to more than one bit/sense line to provide certain space saving advantages. Such accessing arrangements are at times referred to as a 2 ½dimensional operation and are exemplified by, for example, an article in IBM Technical Disclosure Bulletin, Vol. 10, No. 6, Nov. 1967, pp. 776 and 777 and by U.S. Pat. No. 3,693,176, filed Apr. 6, 1970.

In the above-identified U.S. Pat. No. 3,979,734, there is also mentioned a 2 ½dimensional operation which may be utilized in connection with the operation of the bipolar memory disclosed therein. In such 2 ½dimensionally operated bipolar memories the lines may be segmented and one amplifier may be used to amplify signals from several cells.

DISCLOSURE OF THE INVENTION

It is an object of this invention to provide an improved merged charge memory wherein a small number of cells on a word line, such as a byte, may be selected for reading and writing without disturbing other cells on that word line.

It is another object of this invention to provide an improved merged charge memory having very small storage capacitor cells wherein only a few cells on a word line are selected for reading and writing at any particular time to thus utilize fewer sense amplifiers than bit/sense lines.

It is yet another object of this invention to provide an improved memory employing minimum width bit/sense lines and producing small signals which can utilize a high gain amplifier of any suitable desired configuration.

It is still another object of this invention to provide a memory system having an improved ratio of array to support circuit area.

Yet a further object of this invention is to provide an improved memory system having greater freedom in circuit pitch and power dissipation for sense amplifier designs.

A further object of this invention is to provide an improved memory system wherein unselected bit/sense lines associated with a selected word line may be connected to sense amplifiers for providing noise cancellation.

In accordance with the teachings of this invention, a merged charge memory system is provided having an accessing arrangement wherein each of the word lines of the memory array is divided into a plurality of segments or bytes with cells associated only with a selected one or a few segments being coupled at any particular time to bit driving and sensing means. Thus, only relatively few sense amplifiers compared with the number of bits per word of the array are required to handle all of the cells of the array. More particularly, in the merged charge memory system of the present invention, the flow of charges from charge source means is released only to the cells of the selected word segment or segments which are simultaneously coupled to bit driving and sensing means via associated bit/sense lines.

The foregoing and other objects, features and advantages of the invention will be apparent from the follow-

DESCRIPTION OF THE PREFERRED EMBODIMENTS

Figure 1:
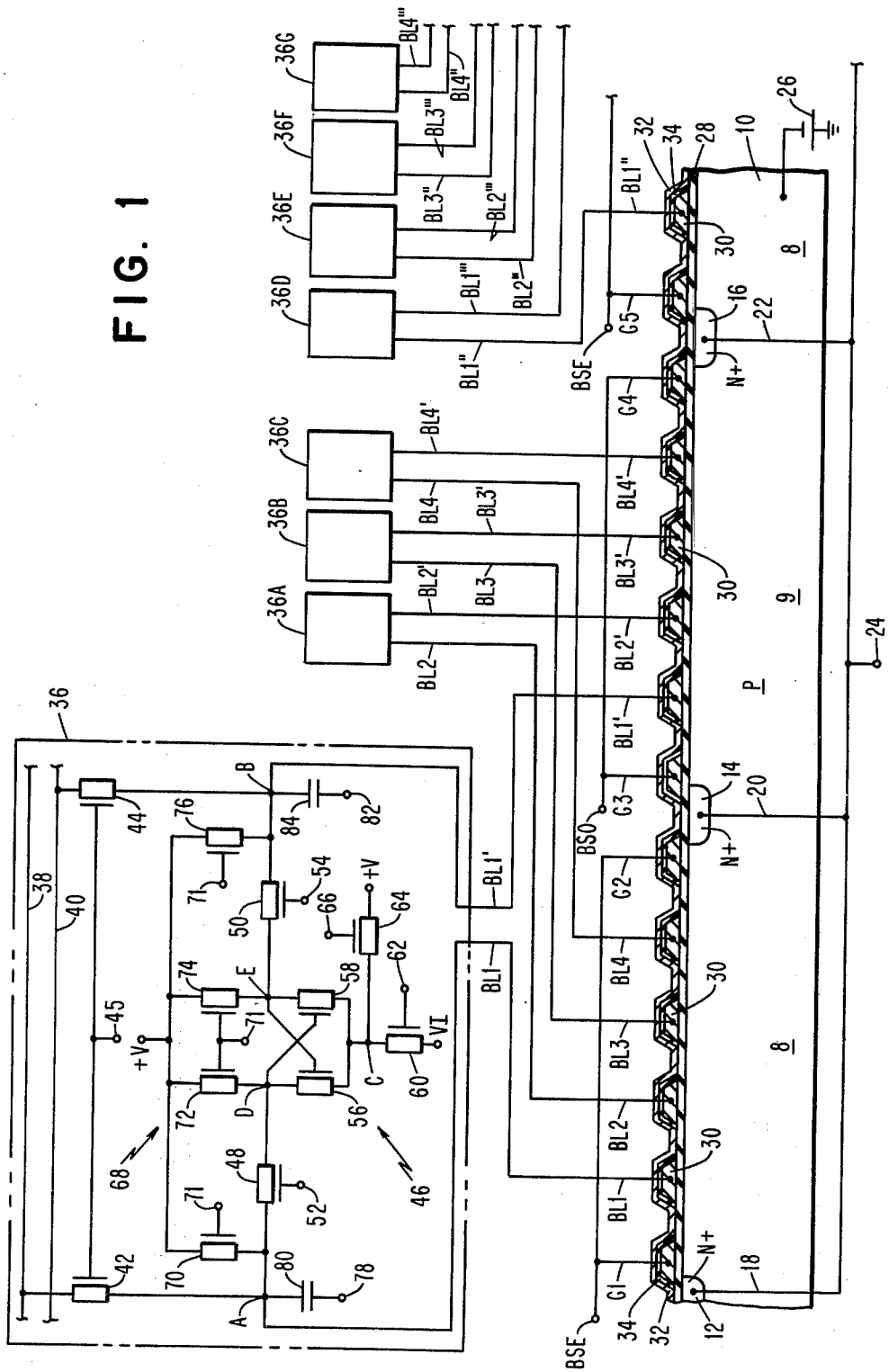
FIG. 1 is a sectional view of an embodiment of a merged charge memory system of the present invention illustrating the memory array in a sectional view to which control and selection circuits are connected.

Referring to FIG. 1 of the drawing in more detail, there is shown a merged charge memory system of the present invention which includes a semiconductor substrate 10 having disposed therein diffusion regions 12, 14 and 16. The substrate 10 may be made of P type conductivity with the diffusion regions 12, 14 and 16 of N+ type. Conductive lines 18, 20 and 22 connect a pulse source terminal 24 to diffusion regions 12, 14 and 16, respectively, for producing pulses of charges from the diffusion regions. An appropriate bias voltage source 26 is connected to substrate 10. Disposed on the surface of substrate 10 is a first insulating layer 28 which may, for example, be made of silicon dioxide. An electrically conductive medium is disposed over the insulating layer 28 and formed into parallel strips 30 extending perpendicular to the plane of the sheet of drawing. The electrically conductive medium is preferably polysilicon. Four of the conductive strips 30 connected to bit/sense lines BL1, BL2, BL3 and BL4 define the memory cells in the system, while two of the conductive strips 30 connected to lines G1 and G2, one of which is disposed at each side of the group of bit/sense lines BL1 to BL4, are used as gate electrodes for controlling the flow of charge from the diffusion regions 12 and 14. The gate electrodes G1 and G2 are connected to a byte select even voltage pulse source BSE. Disposed between diffusion regions 14 and 16 is a second group of conductive strips 30 connected to bit/sense lines BL1', BL2', BL3' and BL4'. Gate electrodes G3 and G4 connected to a byte select odd voltage pulse source BSO are used to control the flow of charges from the diffusion regions 14 and 16, respectively. Other similar groups of conductive strips 30 connected to bit/sense lines may be formed on the substrate as indicated by G5 and BL1". A word line 32, which may be made of, for example, copper doped aluminum, or polysilicon, is disposed over each of the conductive strips 30 and over portions of the first insulation layer 28 disposed between the conductive strips 30. The word line 32 extends perpendicular to the direction of the conductive strips 30 and is insulated from the conductive strips 30 by a second insulation layer 34. The word line 32 is divided into segments or bytes defined by the cells disposed between two successive diffusion regions, such as between diffusion regions 12 and 14, which may be considered as an even byte and identified by reference numeral 8, whereas, alternate bytes, such as the byte between diffusion regions 14 and 16, may be considered as an odd byte 9.

A control circuit 36 is connected to bit/sense lines BL1 and BL1' at nodes A and B. This circuit 36 may be any suitable known circuit. Input and output I/O data buses 38 and 40 are connected to nodes A and B through field effect transistors 42 and 44, respectively, with an I/O control pulse terminal 45 connected to the control electrode of transistors 42 and 44. Also coupled to nodes A and B is a sensing means 46 through isolation transistors 48 and 50, respectively. Select even and select odd pulses are applied to terminals 52 and 54, respectively, connected to the control electrodes of transistors 48 and 50. The sensing means 46 is of the latch type including a pair of cross-coupled transistors 56 and 58 having a common source connection at node C. The control electrode of transistor 58 is connected to transistor 48 through node D and the control electrode of transistor 56 is connected to transistor 50 through node E. The drain electrodes of transistors 56 and 58 are connected to nodes D and E, respectively. A transistor 60 having its control electrode connected to a strobe terminal 62 connects node C to a source of intermediate potential VI. A transistor 64 having a reset terminal 66 connected to its control electrode couples a voltage +V to node C. A precharging circuit 68 couples a +V supply terminal to nodes A, D, E and B through transistors 70, 72, 74 and 76. A precharge (PC) pulse terminal 71 is connected to each of the control electrodes of transistors 70, 72, 74 and 76. An odd signal reference terminal 78 is coupled to node D through first capacitor 80 and an even signal reference (ESR) terminal 82 is coupled to node E through a second capacitor 84.

As can be seen, the control circuit 36 coupled to bit/sense lines BL1 and BL1' includes both sensing means and bit driving means for bit/sense lines BL1 and BL1'. A control circuit 36A similar to control circuit 36 is provided for bit/sense lines BL2 and BL2', control circuit 36B is provided for bit/sense lines BL3 and BL3' and control circuit 36C is provided for bit/sense lines BL4 and BL4'. Similar control circuitry 36D, 36E, 36F and 36G are provided for bit/sense line pairs BL1" and BL1"', BL2" and BL2"', BL3" and BL3"', and BL4" and BL4"', respectively. These latter bit/sense lines are connected to other conductive strips 30, one of which is shown connected to bit/sense line BL1". These other bit/sense lines also form groups of cells or bytes associated with word line 32 and are controlled by byte select even and odd pulses with only the byte select even pulse terminal BSE shown connected to gate electrode G5.

The basic operation of the merged charge memory array is well known and is described in detail in, for example, the above-identified U.S. Pat. No. 4,040,017. As set forth in that patent, a pulse source such as that applied to terminal 24 for producing a charge injection pulse is normally at +8.0 volts but is lowered to 0 volts at predetermined intervals to produce a flow of charges to the system, with the substrate 10 preferably biased at −3.0 volts. A word pulse which varies between −2.0 and +4.5 volts is applied selectively to word line 32 and a bit pulse used to write information into the cells has a rest potential of +8.5 volts, and +4.5 volts for writing, for example, a 1 bit of information. When, for example, a 1 bit of information is being read from a cell, the bit lines having the 1 bit stored therein experience a relatively strong charge signal producing a voltage pulse of significant negative magnitude, while other bit lines representing a 0 bit of information receive a signal of substantially zero voltage magnitude. Such signals are produced in each of the bit lines connecting the conductive strips 30 coupled to the control circuits, such as, control circuit 36.

Figure 2:
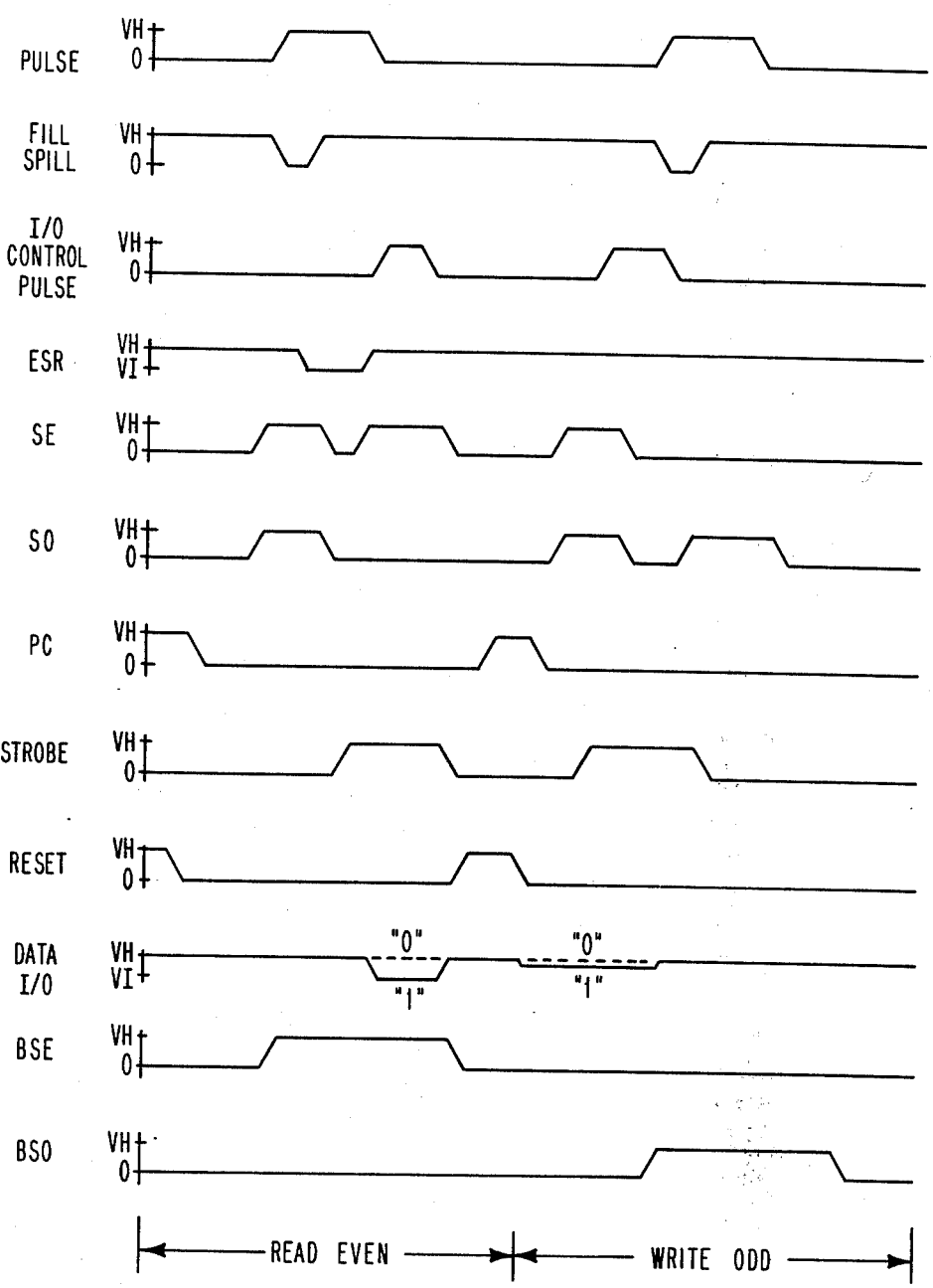
FIG. 2 is a pulse program used to operate the memory system of the invention as illustrated in FIG. 1.

For a better understanding of the operation of the memory system of the present invention, reference may be had to the pulse program indicated in FIG. 2 of the drawing. To read, for example, information which is stored in the memory cells defined by the conductive strips 30 to which bit/sense lines BL1, BL2, BL3 and BL4 are connected, i. e., the even byte 8, control circuits 36, 36A, 36B and 36C, respectively, are utilized as indicated in FIG. 1 of the drawing. Since each of the control circuits 36, 36A, 36B and 36C operate in a similar manner, a detailed description of the operation of only control circuit 36, which senses the signal from bit/sense line BL1, will be described. Prior to reading the information from bit/sense line BL1, a reset voltage VH is applied from terminal 66 to the control electrode of transistor 64 to apply a voltage +V to node C. The Voltage VH is preferably sufficiently higher than the voltage +V so that the entire voltage +V is applied to node C. While the restore pulse is charging node C to +V, precharge pulse PC is applied to transistors 70, 72, 74 and 76 through terminal 71 to precharge nodes A, D, E and B to the voltage +V. The precharge pulse PC is reduced to zero volts shortly after reducing the reset pulse to zero. Select even and select odd pulses SE and SO are then applied to the control electrodes of transistors 48 and 50 through terminals 52 and 54, respectively. Thereafter, the word pulse is applied to word line 32 and the byte select even pulse BSE is applied to the gate electrodes G1 and G2 while a pulse source voltage, indicated as fill-spill, applied to terminal 24 is reduced from VH to zero volts so as to permit electrons or charges to flow from the diffusion regions 12 and 14 to the cells connected to the bit lines BL1, BL2, BL3 and BL4. After the potential wells in the substrate 10 associated with the bit/sense lines BL1, BL2, BL3 and BL4 are filled with charges, the fill-spill charge pulse returns to a magnitude of VH turning off the source of charges from the diffusions 12 and 14 and spilling any excess electrons or charges into the diffusion regions 12 and 14. To detect the information stored in the cell to which the bit/sense line BL1 is connected, an even signal reference voltage ESR of a magnitude VI is applied to terminal 82 to apply to node E through capacitor 84 a reference signal having a magnitude midway between the magnitude of the 0 and 1 binary digit signals produced on the bit/sense lines, as is well known. After the select even and select odd pulses SE and SO are turned off, the strobe pulse is applied to the control electrode of transistor 60 through terminal 62 to lower the voltage at node C from +V to an intermediate voltage VI, which voltage need not necessarily be of the same magnitude as the ESR voltage VI, to thus turn on hard the sensing means 46 in one of its two states. Shortly thereafter the select even pulse SE is again applied to the control electrode of transistor 48 through terminal 52 so as to discharge bit/sense line BL1 through transistors 56 and 60 in the event that the signal on the bit/sense line BL1 was at low magnitude compared with the magnitude of the voltage at node E. Had the voltage on bit/sense line BL1 been high, i.e., higher than the voltage at node E, node E would have been discharged through transistors 58 and 60 and the bit/sense line BL1 would have remained high. With the sensing means latched in a given state the I/O control pulse is applied to the control electrodes of transistors 42 and 44 through terminal 45 to transfer the data or voltage at node D to the I/O data bus line 38. If the voltage on the I/O data bus 38 is now high, that is, at approximately VH, a 0 bit of information is indicated as having been stored in the cell connected to the bit/sense line BL1. If the voltage on the I/O data bus 38 is low, that is an indication that the data stored in the cell coupled to the bit/sense line BL1 was a 1.

While the control circuit 36 is sensing the information stored in the cell coupled to bit/sense line BL1, the control circuits 36A, 36B and 36C are operating in a similar manner to detect the information stored in the cells connected to bit/sense lines BL2, BL3 and BL4, respectively. After the information has been transferred to the input/output data bus 38, the I/O control pulse is returned to zero volts as are the select even SE, strobe and byte select even BSE pulses. To complete the read portion of the cycle for the cells associated with the even groups of cells or bytes of the word line 32, prior to the beginning the write portion of a cycle, for example, for writing the cells in the odd group of cells or bytes identified as those cells coupled to bit/sense lines BL1', BL2', BL3' and BL4', the reset pulse is applied to the control electrode of transistor 64 through terminal 66 to raise the potential at node C to +V volts and the precharge pulse PC is applied to the control electrodes of transistors 70, 72, 74 and 76 to apply +V volts to nodes, A, D, E and B. With the data I/O signal, generally in complementary form, on the I/O data buses 38 and 40, that is, either a 1 or 0 signal, the I/O control pulse is applied to the control electrodes of transistors 42 and 44 through terminal 45 and the select even and select odd pulses SE and SO are applied to the control electrodes of transistors 48 and 50 through the terminal 52 and 54 to transfer the signal from the I/O data buses 38 and 40 to the nodes D and E to latch the sensing means in the appropriate state. The amplitude of the data I/O signal should be kept small to prevent disturbing the contents of non-selected cells on the selected word line, such as the cell connected to bit/sense line BL1 while writing BL1'. The strobe pulse is applied to the control electrode of transistor 60 through terminal 62 to turn on hard the sensing means. The word pulse is again applied to the word line 32 and the full-spill charge source voltage at terminal 24 is decreased to zero volts to permit charges to flow to the cells connected to bit/sense lines BL1', BL2', BL3' and BL4' after the byte select odd pulse BSO is applied to the gate electrodes G3 and G4. The select even and select odd pulses SE and SO are turned off while the sensing means is being latched so that the sensing means is isolated from the large capacitance of the bit/sense lines BL1 and BL1'. When the information is being transferred from node E to the bit/sense line BL1', the select odd pulse so is again turned on. Again, it should be noted that while control circuit 36 is writing information into the cell to which bit/sense line BL1' is connected, control circuits 36A, 36B and 36C are writing information into the memory cells associated with bit/sense lines BL2', BL3' and BL4', respectively. It should be seen that although only four cells are being accessed by the control circuits 36, 36A, 36B and 36C other cells such as the cell connected to bit/sense line BL1'' are being accessed by other control circuits, such as, control circuits 36D, 36E, 36F and 36G. Accordingly, it should be noted that in the embodiment of the invention illustrated in FIG. 1, one-half of all the cells associated with word line 32 are accessed simultaneously during a first period of time and the remaining half of the cells are accessed during a second period of time. It should also be seen that although four cells are indicated as forming a group or byte of information, many more than four cells may be formed in a group or byte. It should be noted that control circuit 36 is coupled to both bit/sense lines BL1 and BL1' and that when the control circuit 36 is sensing the signal from the cell connected to bit/sense line BL1, the bit/sense line BL1' is used as a dummy cell to cancel any noises which may have been produced on the bit/sense line BLI. Also, bit/sense line BL1 is used as a dummy line for bit/sense line BL1' when the cell coupled to the bit/sense line BL1' is being sensed. Furthermore, it should be understood that an odd signal reference is applied to terminal 78 when the signal in the cell connected to bit/sense line BL1' is being sensed. To write information into the cell connected to bit/sense line BL1 and to read information from the cell connected to the bit/sense line BL1' is similar to the operation described hereinabove in connection with the reading and writing into cells connected to bit/sense lines BL1 and BL1', respectively.

Figure 3:
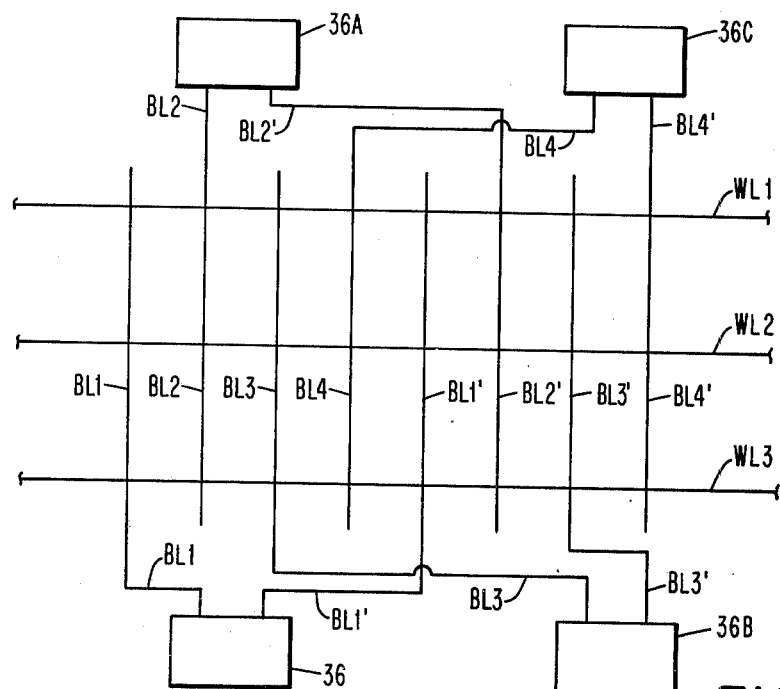
FIG. 3 is a memory system in accordance with the teachings of the present invention illustrating the location of control circuits on both sides of the memory array.

In FIG. 3 there is illustrated schematically a plan view of the layout of the memory system of the present invention including a memory array having eight bit/sense lines BL1, BL2, BL3, BL4, BL1', BL2', BL3' and BL4' associated with three word lines WL1, WL2 and WL3. It can be seen from this figure that control circuits 36, 36A, 36B and 36C may be arranged on both sides of the memory array so that two control circuits 36 and 36B are located on one side of the array and control circuits 36A and 36C are located on the other side of the array. By employing this arrangement, each of the control circuits 36, 36A, 36B and 36C is formed within a dimension equal to four bit/sense lines and four spaces between the bit/sense lines providing a significant amount of freedom for circuit design of any suitable sense amplifier which is capable of detecting the small signals produced from the memory cells of the merged charge memory.

Figure 4:
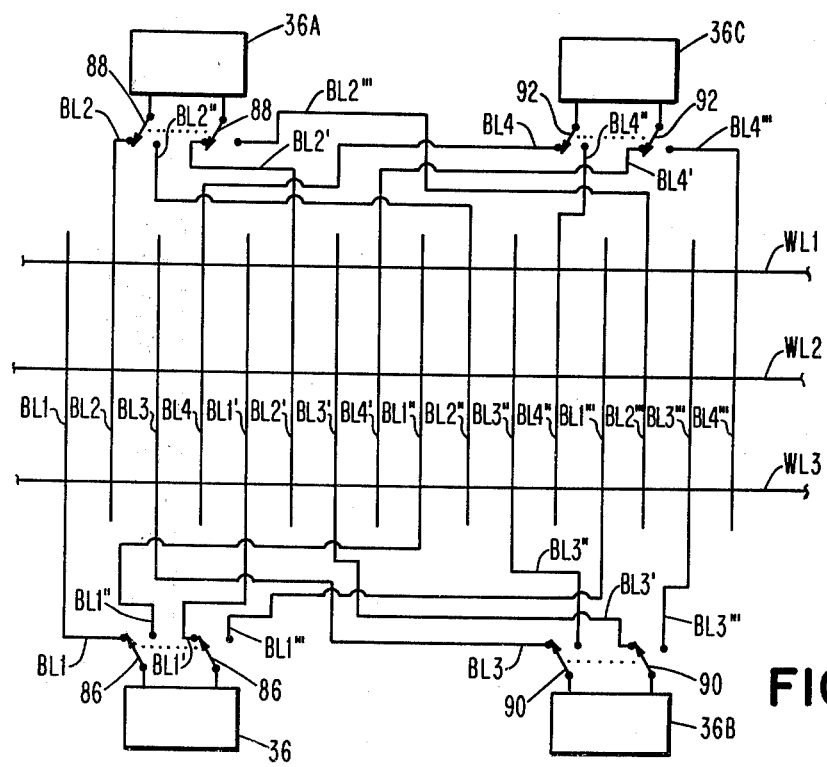
FIG. 4 is a memory system similar to that illustrated in FIG. 3 but which uses switching techniques for increasing the number of bit/sense lines handled by a given number of control circuits in the system.

In accordance with another aspect of this invention, there is illustrated in FIG. 4 of the drawing a memory system similar to that illustrated in FIG. 3 but wherein four control circuits access 16 bit/sense lines BL1, BL2, BL3, BL4, BL1', BL2', BL3', BL4', BL1'', BL2'', BL3'', BL4'', BL1''', BL2''', BL3''' and BL4''' by employing appropriate switching arrangements while maintaining all of the advantages including noise cancellation discussed hereinabove in connection with the other embodiment of this invention. It can be seen that by connecting the control circuits 36, 36A, 36B and 36C to bit/sense lines through appropriate pairs of switches 86, 88, 90 and 92, respectively, the four control circuits 36, 36A, 36B and 36C can sense these signals from bit/sense lines BL1, BL2, BL3, BL4, BL1', BL2', BL3' and BL4' when the switches are located in a first position and, when located in an alternate position, the four control circuits 36, 36A, 36B and 36C can sense the signals from bit/sense lines BL1'', BL2'', BL3'', BL4'', BL1''', BL2''', BL3''' and BL4'''. Accordingly, only four sensing circuits need be provided to sense signals on 16 bit/sense lines. This arrangement permits the design of each sense amplifier and an associated driving circuit in a space on a semiconductor substrate defined by eight bit/sense lines. Of course, it should be understood that each of the switches 86, 88, 90 and 92 may be modified to have two or more pairs of positions instead of only the one pair illustrated in FIG. 4 so that many more than 16 bit/sense lines can be accommodated by the four control circuits 36, 36A, 36B and 36C, if desired.

Figure 5:
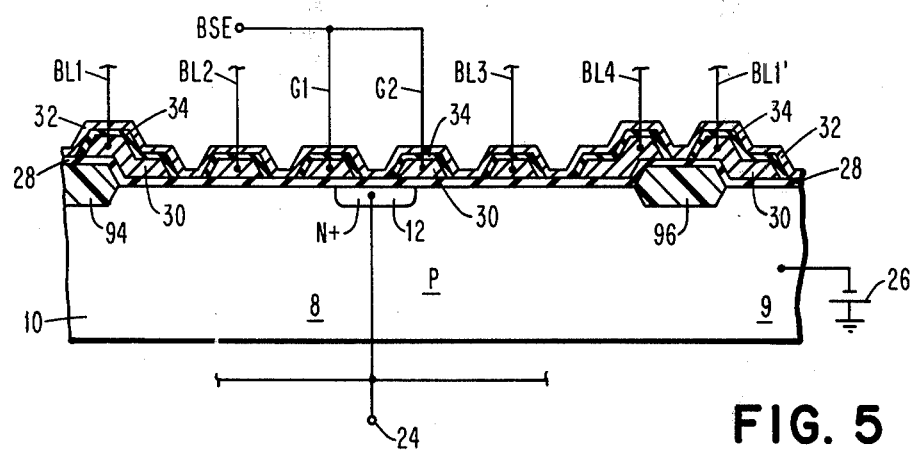
FIGS. 5, 6 and 7 illustrate sectional views of various modifications of the memory array of the system illustrated in FIG. 1 of the drawing.
Figure 6:
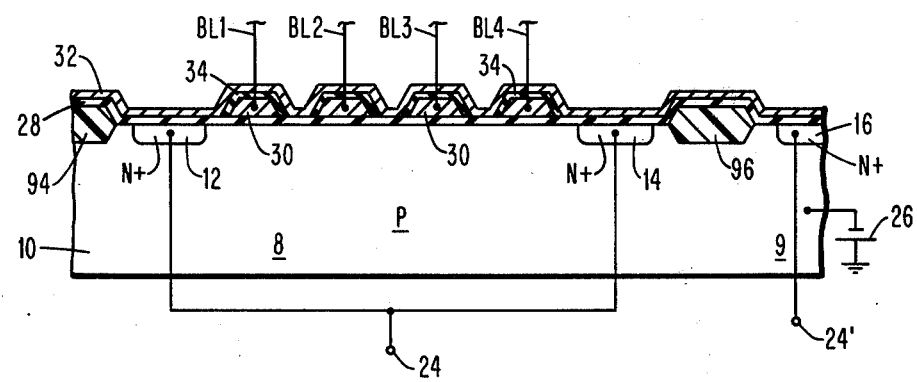
Figure 7:
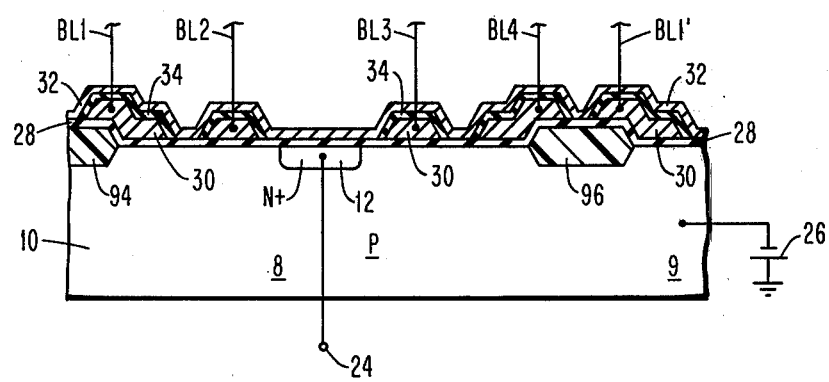

FIGS. 5, 6 and 7 illustrate in sectional views similar to that shown in FIG. 1 other embodiments of the memory array with similar elements having the same reference numerals. In the embodiment illustrated in FIG. 5 of the drawing, a single fill-spill charge source shown at diffusion region 12 is illustrated disposed between two recessed oxide regions 94 and 96. The recessed oxide regions 94 and 96 are provided to restrict the charges from diffusion region 12 to the cells coupled to bit/sense lines BL1, BL2, BL3 and BL4. Thus, the recessed oxide regions 94 and 96 act as charge isolation barriers. Each of the diffusion regions, such as, diffusion region 12, in the substrate 10 has applied thereto a fill-spill charge source pulse which is applied to terminal 24, and the byte or bytes of the word line are selected by the byte select even pulse BSE or the byte select odd pulse BSO as indicated in FIGS. 1 and 2 of the drawings, with byte 8 being selected by applying the byte select even pulse BSE to gate electrodes G1 and G2 as indicated in FIG. 5.

The embodiment of FIG. 6 differs from that of FIG. 1 in that two diffusion regions 12 and 14 are provided adjacent to the recessed oxide regions 94 and 96, respectively, with the cells connected to the bit/sense lines BL1, BL2, BL3 and BL4 being disposed between the two diffusion regions 12 and 14. Additionally, in this embodiment the fill-spill charge source pulse selects the bytes. Accordingly, a first fill-spill charge source pulse is applied through terminal 24 to diffusion regions 12 and 14 to select byte 8 and a second fill-spill charge source pulse is applied through terminal 24' to other diffusion regions including region 16 to select byte 9. The pulses BSE and BSO are not required for this embodiment.

In the embodiment of FIG. 7, the fill-spill charge source pulse applied to terminal 24 also selects the byte but in this instance the fill-spill charge source pulse is applied only to one diffusion region 12 within a byte which is disposed in FIG. 7 between the cells connected to bit/sense line BL2 and bit/sense line BL3.

In FIGS. 5, 6 and 7, the recessed oxide regions 94 and 96 are shown as charge barriers, but if desired, grounded planes, such as those indicated in the above-identified U.S. Pat. Nos. 3,811,076 and 3,841,926, may be used as barriers.

It can be seen that various combinations of byte select techniques may be employed for a particular word line which may include various combinations of control gates and charge sources without departing from the scope of this invention.

It should be noted that within the scope of this invention a merged charge memory system is provided wherein a small number of cells associated with a word line, such as, a byte, may be selected for reading and writing without disturbing all other cells on that word line. By employing this technique, the minimum pitch of a sense amplifier is several times the dimension of the desired bit pitch in the merged charge memory array.

While the invention has been particularly shown and described with reference to preferred embodiments thereof, it will be understood by those skilled in the art that various changes in form and details may be made therein without departing from the spirit and scope of the invention.

What is claimed is:

1. A memory system comprising:
   a semiconductor substrate,
   an insulating layer disposed on said substrate,
   a plurality of spaced apart conductive films disposed on said layer defining a plurality of groups of storage capacitors,
   a group of sensing means,
   means including a conductive strip disposed on said insulating layer between said films to cause conduction between the capacitors within each of said groups of capacitors,
   a plurality of charge source means,
   means for applying charges from one of said plurality of charge source means to a selected group of said plurality of groups of storage capacitors while isolating the other of said plurality of groups of capacitors from said plurality of charge source means, and
   means for coupling said group of sensing means to said selected group of capacitors to sense charge displacement in the capacitors of said selected group.

2. A memory system comprising:
   first, second, third and fourth storage capacitors each having first and second electrodes,
   first, second, third and fourth switches,
   first and second charge sources,
   means for selectively interconnectinfg the first electrodes of said first and second capacitors through said first switch and said first electrode of said second capacitor through said second switch to said first charge source and the first electrodes of said third and fourth capacitors through said third switch and said first electrode of said fourth capacitor through said fourth switch to said second charge source,
   first and second means selectively coupled to the second electrodes of two of said first, second, third and fourth capacitors for simultaneously applying data pulses to said two capacitors, and
   means for controlling said first and second charge sources so as to apply charges to said two storage capacitors from one of said sources while electrically isolating other storage capacitors from said sources.

3. A memory system as set forth in claim 2 further including additional storage capacitors and switching means, said switching means selectively coupling said data pulse applying means to said first, second, third and fourth capacitors and to said additional capacitors.

4. A memory system as set forth in claim 2 wherein said first charge source is disposed between said first and second capacitors and said second source is disposed between said third and fourth capacitors.

5. A memory system as set forth in claim 2 wherein each of said sources includes two portions with each of said portions being disposed between said isolating means and said capacitors.

6. A memory system as set forth in claim 2 wherein said means for controlling includes gating means disposed between said sources and said capacitors.

7. A memory system as set forth in claim 2 wherein said switches are operated simultaneously.

8. A memory system as set forth in claim 7 wherein said selectively interconnecting means includes a memory word line and a word pulse applied to said word line, and wherein said switches are operated by said word pulse.

9. A memory system as set forth in claim 8 wherein one of said first and second capacitors and one of said third and fourth capacitor are selectively coupled to said first data pulse applying means and wherein the other of said first and second capacitors and the other of said third and fourth capacitors are selectively coupled to said second data pulse applying means.

10. A memory system as set forth in claim 9 further comprising a plurality of control circuits each of which includes one of said data pulse applying means and a sensing means.

11. A memory system as set forth in claim 10 further including additional storage capacitors and switching means, said switching means selectively coupling said control circuits to said first, second, third and fourth capacitors and to said additional capacitors.

* * * * *